United States Patent
Markow et al.

[11] Patent Number: 6,043,981
[45] Date of Patent: Mar. 28, 2000

[54] HEAT SINK ASSEMBLY FOR ELECTRICAL COMPONENTS

[75] Inventors: Paul A. Markow, Huntsville; Karl W. Shock; Bradley S. Chupp, both of Madison; Luis J. Morenilla; Frank R. Holmes, both of Huntsville; Stephen W. Burcham, Madison, all of Ala.

[73] Assignee: Chrysler Corporation, Auburn Hills, Mich.

[21] Appl. No.: 08/969,597

[22] Filed: Nov. 13, 1997

[51] Int. Cl.[7] .............................. H05K 7/20; H05K 7/12
[52] U.S. Cl. ..................... 361/704; 361/688; 361/690; 361/707; 361/711; 361/714; 165/80.3
[58] Field of Search ..................... 361/706, 688, 361/689, 690, 707, 709, 711, 712, 713, 714, 715, 716, 717, 719, 720, 721, 722; 165/80.3, 185; 174/16.3

[56] References Cited

U.S. PATENT DOCUMENTS

| | | | |
|---|---|---|---|
| 4,674,005 | 6/1987 | Lacz | 361/388 |
| 4,707,726 | 11/1987 | Tinder | 357/81 |
| 4,845,590 | 7/1989 | Mikolajczak | 361/386 |
| 4,891,735 | 1/1990 | Mikolajczak . | |
| 4,922,601 | 5/1990 | Mikolajczak . | |
| 4,923,179 | 5/1990 | Mikolajczak . | |
| 5,003,429 | 3/1991 | Baker et al. | 361/386 |
| 5,065,279 | 11/1991 | Lazenby et al. | 361/386 |
| 5,138,523 | 8/1992 | Benck et al. | 361/386 |
| 5,212,627 | 5/1993 | No | 361/386 |
| 5,276,584 | 1/1994 | Collins et al. | 361/718 |
| 5,280,409 | 1/1994 | Selna et al. | 361/720 |
| 5,296,739 | 3/1994 | Heilbronner et al. | 257/687 |
| 5,307,236 | 4/1994 | Rio et al. | 361/720 |
| 5,402,313 | 3/1995 | Casperson et al. | 261/710 |
| 5,513,070 | 4/1996 | Xie et al. | 361/700 |
| 5,590,026 | 12/1996 | Warrent et al. | 361/704 |
| 5,623,394 | 4/1997 | Sherif et al. | 361/705 |
| 5,880,093 | 3/1999 | Markow et al. . | |

FOREIGN PATENT DOCUMENTS

| | | | |
|---|---|---|---|
| 404171995A | 6/1992 | Japan | H05K 7/20 |
| 409083878A | 3/1997 | Japan | H04N 5/335 |
| 409283674A | 10/1997 | Japan | H01L 23/40 |
| 410107189A | 4/1998 | Japan | H01L 23/36 |

*Primary Examiner*—Leo P. Picard
*Assistant Examiner*—Anatoly Vortman
*Attorney, Agent, or Firm*—Marc Lorelli

[57] ABSTRACT

A heat sink assembly to remove heat from electrical components mounted on a circuit board is disclosed. The assembly contains a housing that is formed from a suitable heat sinking material and is appropriate for receiving a circuit board with surface mounted electrical components. The invention provides an improved apparatus for establishing thermal contact from a heat generating, surface mounted electrical component to the housing. A resilient biasing element is fixed in relation to the circuit board and the housing in order to urge the circuit board with a plurality of surface mounted electrical components in thermal contact with the housing. Once the heat sink is assembled the invention provides various means for which heat can be readily transferred from the electrical components to the housing. Heat can be transferred away from the electrical component to the housing through a thermal via incorporated within the circuit board, though the resilient biasing element, or by direct contact of the electrical component and the housing.

7 Claims, 2 Drawing Sheets

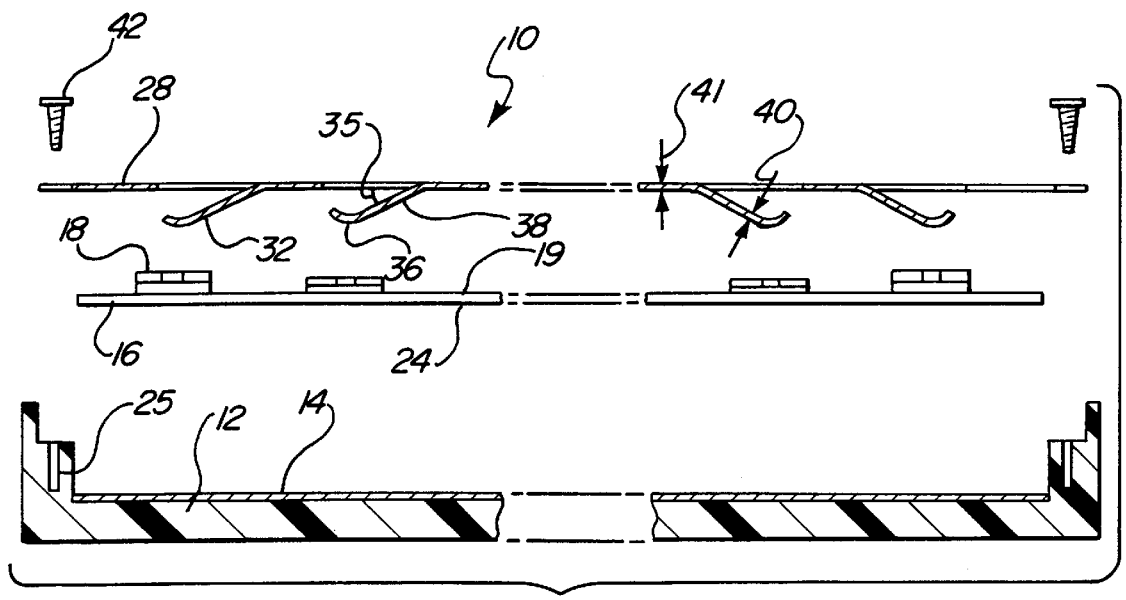
FIG-2
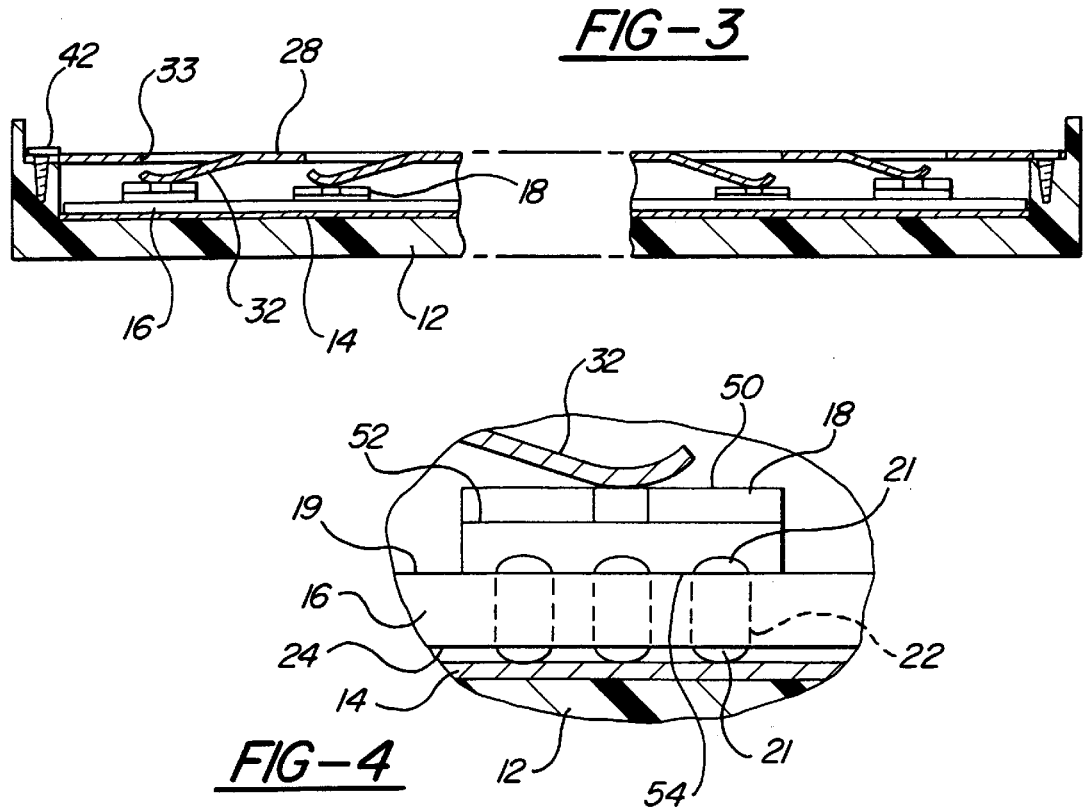
FIG-3
FIG-4

HEAT SINK ASSEMBLY FOR ELECTRICAL COMPONENTS

BACKGROUND AND SUMMARY OF THE INVENTION

The present invention relates, in general, to heat sink assemblies for electrical components and, more specifically, to heat sinks that employ a resilient biasing element to establish thermal contact between the heat generating electronic components mounted on the surface of a circuit board and the heat sink.

Electric components generate heat that cannot be adequately dissipated in ambient conditions. The heat that is generated from an electrical component must be transferred away from the electrical component. If the heat is not removed, the performance of the electrical component will deteriorate. An effective way to remove heat from electrical components is to securely position the electrical component in thermal contact with a heat sink. A heat sink assembly generally contains a housing that is formed from a material, such as aluminum, that readily conducts heat; such construction makes the housing capable of performing the duties of a heat sink. The housing has the ability to draw the heat from the electrical component and to spread the heat over a large surface area that is exposed to the environment. Typically the housing is lined with a film that is electrically insulative, so the function of the electrical components is not affected.

Surface mounted electrical components have been employed in other heat sink assemblies, such as U.S. Pat. No. 5,280,409 issued Jan. 18, 1994 to Sun Microsystems ad U.S. Pat. No. 5,307,236 issued Apr. 26, 1994 to Alcatel Telspace, however these inventions do not allow for variation in configuration of the surface mounted electrical components, a slight change in the electrical component would require a substantial redesign of the whole assembly.

Resilient biasing elements have been utilized to retain electrical components in thermal contact with the housing. U.S. Pat. No. 4,845,590 issued Jul. 4, 1989 and U.S. Pat. No. 5,274,193 issued Dec. 28, 1993, both assigned to the assignee of the present invention have demonstrated a satisfactory apparatus utilizing a resilient biasing element; however, these inventions can only accommodate electrical components that are attached perpendicularly to a circuit board.

The essential components of these heat sink assemblies are those components that provide or force thermal contact between the electrical components and the housing. It is desirable to increase the level of robustness and decrease the complexity of these essential components when compared to the prior art. It is also desirable, for both reliability and packaging considerations, to use electrical components that are mounted on the surface of a circuit board.

According, it is an object of this invention to provide an improved system for ensuring a thermal contact between a surface mounted electrical component and a housing. The present invention uses a resilient biasing element to ensure that the electrical components mounted on the surface of a circuit board are in thermal contact with the housing. The resilient biasing element is comprised of a body member with a plurality of protruding resilient fingers. The present invention also provides various means to establish thermal contact between the electrical components and the heat sink housing. This thermal contact can be established through a thermal via incorporated in the circuit board, through the resilient biasing element, or by direct contact between the electrical component and the housing.

It is another object of the current invention to design a heat sink assembly that can be easily manufactured and be adaptive to various circuit board configurations. The present invention's use of a resilient biasing element comprised of a body member with a plurality of protruding resilient fingers help to minimize the number of screws or other attachment devices that are needed, as well as, eliminate the need for precise placement of the circuit board and of the electrical components on the surface of the circuit board. The present invention also allows for dissimilar electrical components to be attached to the circuit board, i.e. non-surface mounted electrical components.

It is yet another object of the present invention to design a heat sink assembly that requires a minimal amount of space. The present invention employs a parallel arrangement of housing, circuit board with plurality of electrical components, and resilient biasing element which helps to minimize the overall height of the entire heat sink assembly.

Additional benefits and advantages of the present invention relates from a reading of the subsequent description of the preferred embodiment and the appended claims, taken in conjunction with the accompanying drawings.

BRIEF DESCRIPTION OF THE DRAWINGS

FIG. 2 is an exploded sectional view of the heat sink assembly taken along the line 2—2 of FIG. 1.

FIG. 3 is a assembled sectional view of the heat sink assembly taken along the line 2—2 of FIG. 1.

FIG. 4 is a magnified view of the resilient finger, electrical component, circuit board and housing.

DETAILED DESCRIPTION OF THE PREFERRED EMBODIMENT

Figure 1:
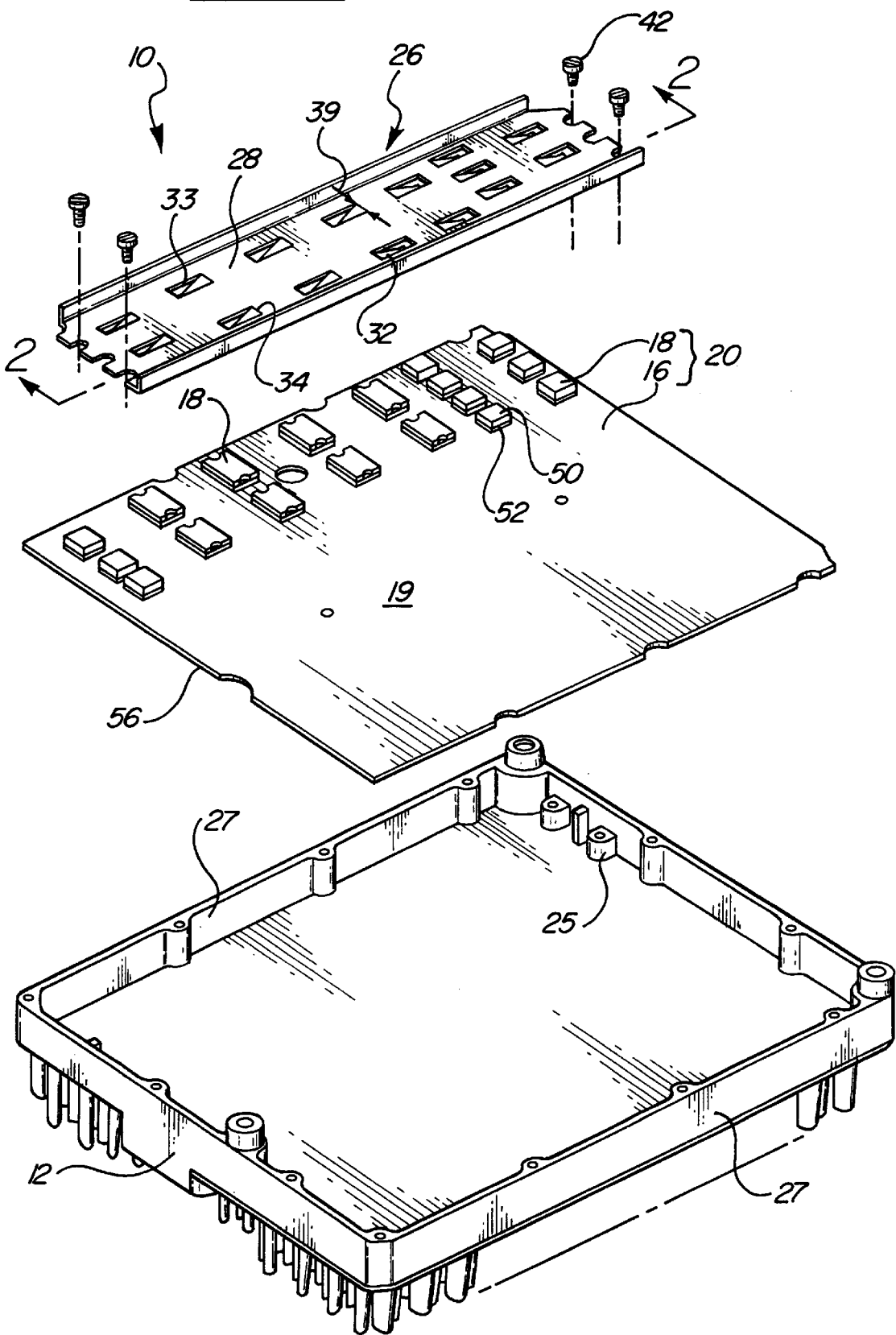
FIG. 1 is an exploded plan view of the heat sink assembly.

Referring to the figures, particularly FIG. 1., a complete heat sink assembly 10 is illustrated in a pre-assembled view. The complete heat sink assembly includes a housing 12 that performs the duties of a heat sink and protects its contents from the environment. In the preferred embodiment, the housing 12 is generally covered with a thin lining 14 shown in FIG. 2 and FIG. 3. The lining 14 is electrically insulative so the performance of any electrical devices that might be in contact with the housing are not affected. The lining 14 is thermally conductive and may be in the form of a gel or a film. The housing 12 has a generally planar surface.

The housing is suitable for receiving a circuit board 16 having a perimeter 56 that circumscribes the top face 19 and bottom face 24 (shown in FIG. 4) of the circuit board 16. The circuit board 16 has a plurality of surface mounted electrical components 18 that, in operation, generate heat. Each surface mounted electrical component 18 includes a perimeter that is disposed within the perimeter of the circuit board 16 as shown in FIG. 1. Surface mounted electrical components 18 are those electrical components whose body, barring any extremities or connection devices, as shown by the numeral 18 is in direct physical contact with a face of the circuit board. The electrical components 18 include a top-most surface 50 that is circumscribed by the perimeter 52 of the electrical component 18. The perimeter bounds top most surface 50 and extends downward to contact the bottom most surface 54 (shown in FIG. 4) of the electrical component 18. In the preferred embodiment, the surface mounted electrical components 18 are attached to the top face of the circuit board 19. The assembly 20 comprises the circuit board 16 and the plurality of surface mounted electrical components 18. Thermal vias 21 are provided as a possible thermal transport means for heat transferred away from the surface mounted electrical components 18. Thermal transport means is defined as an apparatus that readily conducts heat. In the present invention thermal transport means enables the heat produced by the surface mounted electrical components 18 to be transferred to the housing 12. The thermal vias 21 are provided by drilling holes or openings 22 in the circuit board 16 and plating the openings 22 with a thermally conductive material, such as copper or solder. This plating operation not only provides a heat transfer path but it also secures the electrical component 18 to the circuit board 16. A thermal via 21 extends from the surface mounted electrical component 18 on the top face of the circuit board 19 to the opposite face of the circuit board 24. The thermal vias 21 are produced from a thermally conductive material in large enough number and size to allow for the necessary heat conduction away from the surface mounted electrical component 18. The circuit board 16 is not physically attached to the housing 12, instead it is given the necessary room expand when subjected to higher temperatures, it is however, loosely fixed in position by mounting formations 25. Other formations 27 limit lateral movement, such formations can be in the form of a peripheral wall or a simple projection from the housing 12.

Disposed directly above the circuit board with a plurality of surface mounted electrical components 20 is the resilient biasing element 26. Circuit board 20 is nested between the electrical components 18 and the housing 12 as shown in FIG. 3, furthermore, circuit board 20 and the plurality of surface mounted electrical components 18 are nested between the housing 12 and the resilient biasing element 26. The resilient biasing element 26 is comprised of a body member 28 with a plurality of resilient fingers 32 protruding therefrom in a direction normal thereto, as best seen in FIG. 2. The body member 28 is generally planar and parallel with the generally planar surface of housing 12 and the circuit board 20. The body member 28 also makes accommodations for a plurality of U-shaped notches 33. Each U-shaped notch 33 forms a struck out portion that produces a resilient finger 32 that protrudes from and is integral with the edge portion 34 of the body member 28. The edge portion 34 is circumscribed by the U-shaped notch 33. The resilient fingers 32 are used to urge the circuit board with plurality of surface mounted electrical components 20 in a direction normal thereto as shown in FIG. 3, into proper position with relation to the housing 12. This proper position is defined as an orientation that allows for thermal transport means to contact the plurality of surface mounted electrical components 18 and the housing 12. In the preferred embodiment, the circuit board with plurality of electrical components 20 by means of a thermal via thermally contact the thin lining 14 that covers the housing 12. The housing 12 dissipates heat away from the circuit board with plurality of surface mounted electrical components 20 to the environment. The formation of the resilient finger 32 is adapted for applying pressure to the circuit board with plurality of surface mounted electrical components 20. The resilient finger 32 can be designed to apply a specific force to either the circuit board 16 or the surface mounted electrical components 18. In the preferred embodiment, the resilient fingers 32 contact the top-most surface 50 of the surface mounted electrical components 18. Generally, the number of resilient fingers 32 correspond with the number of surface mounted electrical components 18. The resilient finger 32 extends from the body member 28 at an angle 35 and possesses a curved portion 36 to ensure contact to the surface mounted electrical component 18. The resilient finger 32 also comprises a thin stem 38, a width 39, and a thickness 40. Thickness 40 is, in general, similar to the thickness of the body member 41. The resilient finger 32 is designed so that the curved portion 36, the thin stem 38, the angle 35, the width 39, and the thickness 40 are configured to provide the desired force onto the surface mounted electrical component 18. The resilient biasing element 26 is attached to the housing 12 at the mounting formations 25 by screws 42 in the preferred embodiment, however any means for attaching would not deviate from the scope of the present invention. The resilient biasing element 26, if constructed from a suitable thermally conductive material, can also be used as thermal transport means.

As can be best seen in FIG. 4, with continued reference to FIG. 1, the entire bottom most surface 54 of the electrical component 18 contacts the circuit board 16. The complete contact of the bottom most surface 54 to the circuit board 16 requires that the perimeter 52 of the electrical component 18 be disposed entirely within the perimeter 56 of the circuit board.

The circuit board 16 can be installed with the surface mounted electrical components 18 in direct contact will the housing 12, in other words, the surface mounted electrical components 18 can be attached on the opposite face of the circuit board 24. This establishes thermal transport means that is the direct result of contact between the surface mounted electrical component 18 and the housing 12 or the lining 14 covering the housing 12. This embodiment does not deviate from the scope of this invention; however, this embodiment is not preferred because it puts unnecessary size limitations on the surface mounted electrical components 18.

While the preferred embodiment has been described in accordance with the present invention, it is understood that the invention is susceptible to numerous changes and modifications from those skilled in the art without deviating from the scope and spirit of the following claims.

What is claimed is:

1. A heat sink assembly for a circuit board with a plurality of surface mounted electrical components, said electrical components having a top most surface and a bottom most surface, said circuit board adapted for use in a housing suitable for receiving said circuit board, said invention comprising:

a resilient biasing element fixed in relation to said circuit board and said housing and comprising a planar body member with a plurality of protruding resilient fingers extending from said body member in a cantilevered fashion, said planar body member disposed parallel to said circuit board, said resilient fingers include a curved portion for contacting said circuit board with a plurality of surface mounted electrical components and urge said circuit board in a direction normal to said generally planar body member and normal to said circuit board, and wherein said circuit board is nested between said housing and said resilient biasing element and at least one of said plurality of said electrical components is disposed such that the entire bottom most surface thereof is in substantial contact with said circuit board.

2. The invention according to claim 1, wherein said circuit board includes a first face and a second face with a perimeter surrounding said first face and wherein at least one of said plurality of electrical components includes a perimeter disposed within said perimeter of said circuit board, said at least one of said plurality of said electrical component being mounted on said circuit board.

3. The invention according to claim 1, wherein said circuit board includes a first face, second face, and at least one opening having a thermally conductive material therein; said thermally conductive material extends from at least one of said plurality of surface mounted electrical components on said first face of said circuit board through said opening to said second face of said circuit board to transfer heat from said at least one electrical component to said second face of said circuit board, said second face of said circuit board being nested between said housing and said at least one surface mounted electrical components.

4. The invention according to claim 1, wherein said resilient biasing element comprising said body member with said plurality of protruding resilient fingers further comprising:

said body member having a plurality of U-shaped notches with an edge portion, said body member having a thickness;

at least one of said plurality of protruding resilient fingers being integrally formed and cantilevered from said edge portion, said edge portion being circumscribed by at least one of said plurality of U-shaped notches;

at least one of said plurality of protruding resilient fingers possessing a curved portion that contacts said circuit board with said plurality of surface mounted electrical components; and an attachment element adapted to secure said body member with said plurality of protruding resilient fingers to said housing.

5. The invention as set forth in claim 4, wherein said at least one of said plurality of protruding resilient fingers are integrally formed with said body member.

6. A heat sink assembly comprising:

a circuit board having two faces, a top face and a bottom face, said circuit board includes a perimeter surrounding said first face;

a plurality of surface mounted electrical components having a bottom most surface disposed in substantial contact with said top face of said circuit board, each of plurality of said electrical components include a perimeter circumscribing said bottom most face;

a housing having a generally planar surface and adapted to receive said circuit board; and a resilient biasing element fixed in parallel relation to said circuit board and said generally planar surface of said housing, said resilient biasing element includes a cantilevered finger that contacts either said circuit board or one of said plurality of said surface mounted electrical components, said cantilevered finger includes a curved portion in contact either said circuit board or one of said plurality of said surface mounted electrical components, said curved portion of said cantilevered finger of said resilient biasing element urges said circuit board in a direction normal thereto to ensure contact between said circuit board and said housing;

wherein said circuit board is disposed directly above said generally planar surface of said housing and directly below said plurality of surface mounted electrical components and said resilient biasing element;

wherein at least one of said plurality of electrical components includes a perimeter disposed completely within said perimeter of said circuit board, said at least one electrical component being mounted on said circuit board.

7. A heat sink assembly for a circuit board with a plurality of surface mounted electrical components for use in a housing suitable for receiving said circuit board, said invention comprising:

a resilient biasing element fixed in relation to said circuit board and said housing and comprising a planar body member with a plurality of resilient fingers protruding from said body member in a direction normal thereto, said planar body member disposed parallel to said circuit board, said resilient fingers adapted to contact said circuit board with a plurality of surface mounted electrical components and urge said circuit board in a direction normal to said generally planar body member and normal to said circuit board;

said body member having a plurality of U-shaped notches with an edge portion, said body member having a thickness;

at least one of said plurality of protruding resilient fingers extending freely being cantilevered from said edge portion, said edge portion being circumscribed by at least one of said plurality of U-shaped notches, said at least one of said plurality of protruding resilient fingers having a thickness substantially equal to said thickness of said body member;

at least one of said plurality of protruding resilient fingers possessing a curved portion adapted to contact said circuit board with said plurality of surface mounted electrical components;

an attachment element adapted to secure said body member with said plurality of protruding resilient fingers to said housing; and wherein said at least one of said plurality of protruding resilient fingers are integrally formed with said body member.

* * * * *